United States Patent
Blednov

(10) Patent No.: US 8,482,353 B2
(45) Date of Patent: Jul. 9, 2013

(54) DOHERTY AMPLIFIER

(75) Inventor: Igor Blednov, Nijmegen (NL)

(73) Assignee: NXP B.V., Eindhoven (NL)

( * ) Notice: Subject to any disclaimer, the term of this patent is extended or adjusted under 35 U.S.C. 154(b) by 99 days.

(21) Appl. No.: 12/967,912

(22) Filed: Dec. 14, 2010

(65) Prior Publication Data

US 2011/0140786 A1 Jun. 16, 2011

(30) Foreign Application Priority Data

Dec. 15, 2009 (EP) .................................... 09179349

(51) Int. Cl.
*H03F 3/68* (2006.01)

(52) U.S. Cl.
USPC ..................... 330/295; 330/124 R

(58) Field of Classification Search
USPC ............. 330/124 R, 295, 84, 286, 53–54
See application file for complete search history.

(56) References Cited

U.S. PATENT DOCUMENTS

| | | | |
|---|---|---|---|
| 5,886,575 A | 3/1999 | Long | |
| 7,345,535 B2 * | 3/2008 | Kwon et al. | 330/124 R |
| 7,786,797 B2 * | 8/2010 | Okazaki et al. | 330/124 R |
| 2002/0113655 A1 | 8/2002 | Lautzenhiser et al. | |
| 2004/0222847 A1 | 11/2004 | Khanifar et al. | |
| 2006/0001485 A1 | 1/2006 | Parker et al. | |
| 2007/0075780 A1 | 4/2007 | Krvavac et al. | |
| 2008/0068078 A1 | 3/2008 | Iwasaki | |
| 2011/0169590 A1 * | 7/2011 | Namerikawa et al. | 333/136 |

FOREIGN PATENT DOCUMENTS

| | | |
|---|---|---|
| WO | 03/065599 A1 | 8/2003 |
| WO | 2006/067705 A1 | 6/2006 |
| WO | 2007/119208 A2 | 10/2007 |

OTHER PUBLICATIONS

Extended European Search Report for European Patent Appln. No. 09179349.7 (May 7, 2010).

* cited by examiner

Primary Examiner — Hieu Nguyen

(57) ABSTRACT

A combination amplifier, in particular a Doherty amplifier allowing dynamic biasing, is provided, the combination amplifier comprising a first amplifier ($3,3a,3b$) having a first input terminal ($11,11a,11b$) and a first output terminal ($25, 25a,25b$); a second amplifier ($5,5a,5b$) having a second input terminal ($27,27a,27b$) and a second output terminal ($29,29a, 29b$); a first impedance inverter ($L_i$, $43b$) connected between the first input terminal and the second input terminal; and an envelope detector ($33,33a,33b$) comprising a detector output terminal and a detector input terminal which is connected to the first output terminal.

10 Claims, 4 Drawing Sheets

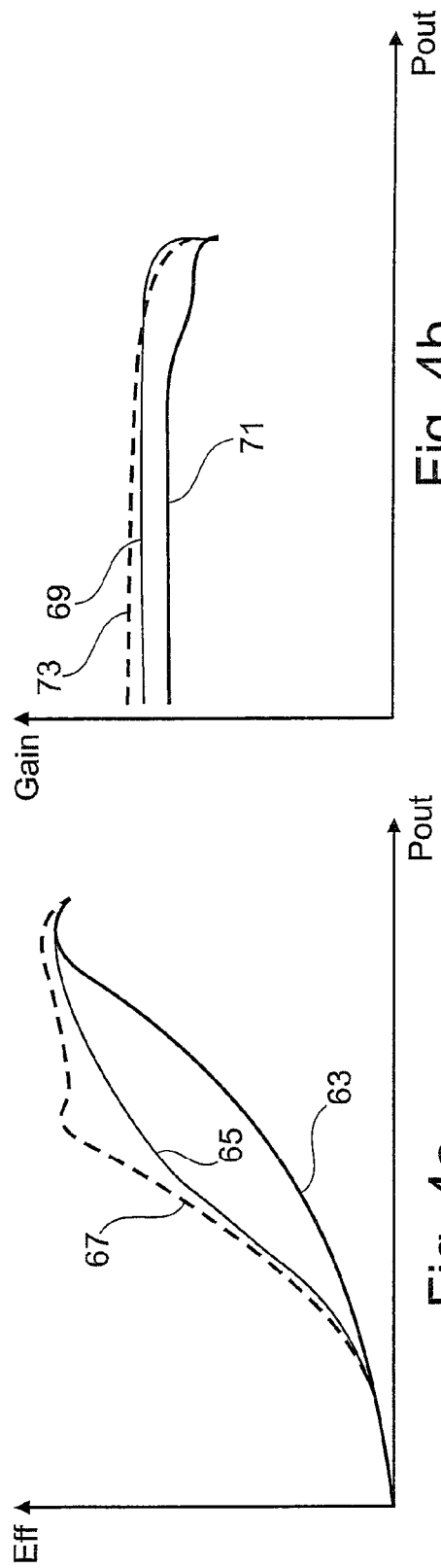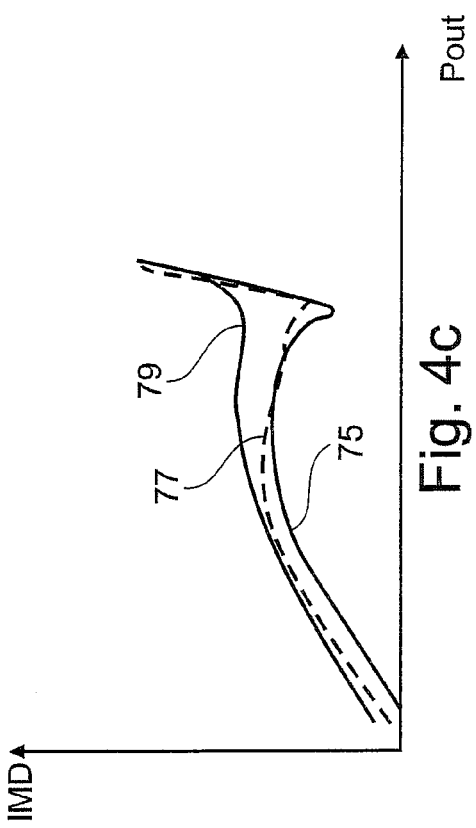

DOHERTY AMPLIFIER

CROSS-REFERENCE TO RELATED APPLICATIONS

Figure 1:
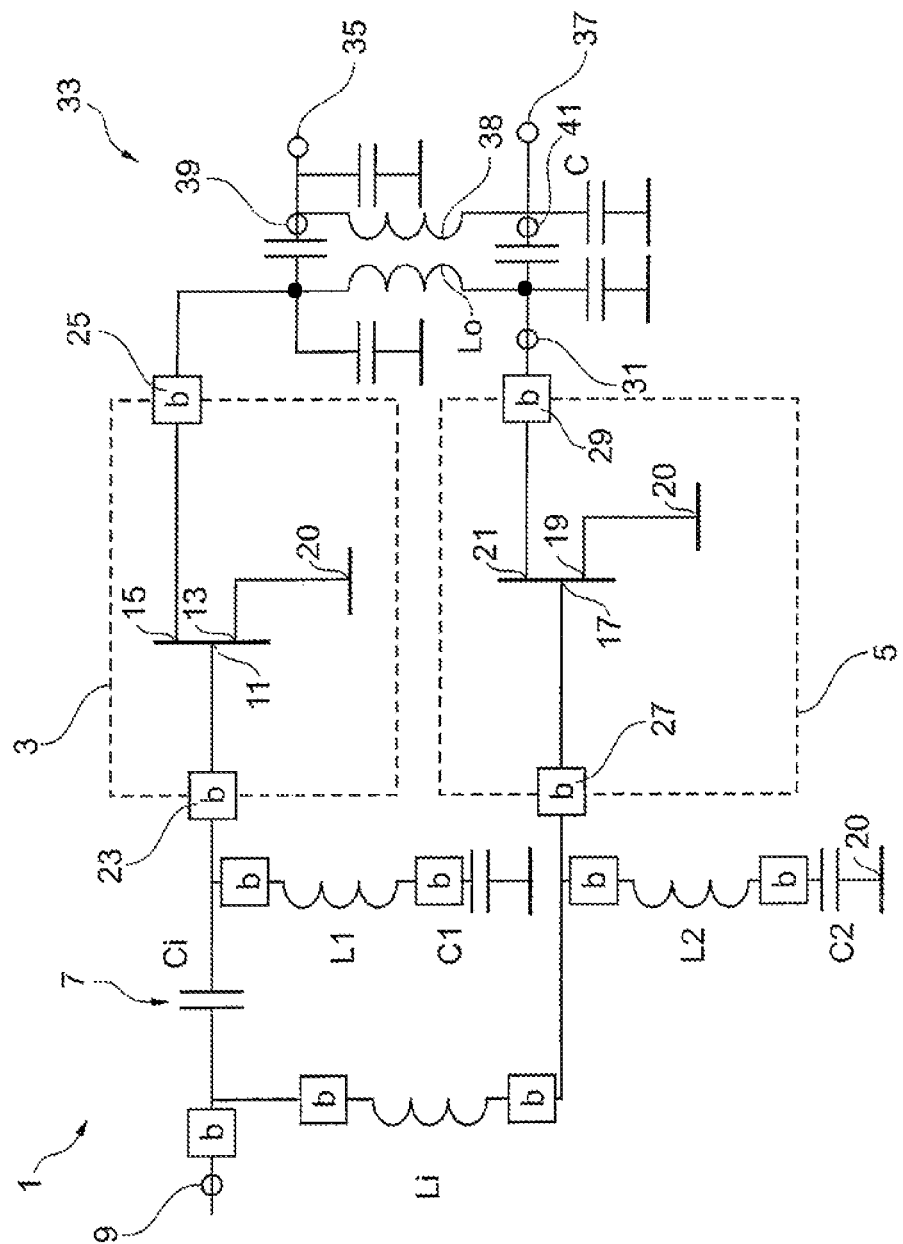

This application claims the priority under 35 U.S.C. §119 of European patent application no. 09179349.7, filed on Dec. 15, 2009, the contents of which are incorporated by reference herein.

The present invention relates to a combination amplifier, in particular a Doherty amplifier. Further in particular, the present invention relates to a Doherty amplifier comprising an envelope detector. More in particular, the present invention relates to a Doherty amplifier allowing dynamic bias control.

In communication technology, such as wireless communication technology, very high power RF-amplifiers are required for transmitting modulated RF-signals, having time variable amplitude and characterised by ratio of peak power to average power level (PAR). The used RF-amplifiers need not only to output high power but should also amplify the RF-signal in a linear manner and with high efficiency at average power level. For amplification different types of transistors may be used. Further, the transistors may be operated in different classes. The operational class (A-, AB-, B- and C-class) of a transistor or generally of an amplifier may depend on conduction angle θ. In case of FET the conduction angle θ may be defined by a relation comprising a value of a DC bias voltage Vbias applied to a gate of the transistor, a gate threshold voltage Vt and a voltage amplitude of input signal, from which in case of LDMOS a conduction angle θ can be derived by the following expression:

$$\theta = 2\cos^{-1}\left(\frac{V_t - V_{bias}}{V_{gs}}\right)$$

To operate in class C a low Vbias voltage below Vt may be applied to the gate of the transistor such that the gate of the transistor conducts only in a small portion over one whole period of a sine wave (corresponding to 360°) of the RF-signal which portion may be specified by a conduction angle below 90°. Class B is characterised by conduction angle equal to 90° when Vbias=Vt, while AB-class usually occupy the conduction angle range 90° to 120°. To operate in class A, a much higher voltage Vbias>Vt may be applied to the gate of the transistor such that the transistor gate conducts over a whole period of RF signal sine wave characterized by a conduction angle equal to 180° or larger. Depending on the operation class a transistor may have different properties regarding a gain, efficiency, and linearity. Generally, an amplifier operated in class A exhibits high gain and high linearity, but very low efficiency (<50% as best), whereas an amplifier operated in class AB exhibits lower gain but better efficiency (<78.5% as best). C-class operation is characterised by best efficiency, but very poor linearity and even lower gain depending on gate bias condition or conduction angle. As mentioned above, the operation class of an amplifier may depend on a bias voltage applied to a gate of the transistor.

A conventional Doherty amplifier comprises two amplifiers operating in different classes, such as usually AB-class and C-class, which receive different portions of an input signal, amplify the different portions and combine the amplified different portions at an output terminal. Thereby, one of the amplifiers, also called the main (or carrier) amplifier, may be operated in class AB and the other amplifier, also called the peak amplifier, may be operated in class C. It has been observed that the Doherty amplifier is more efficient at average power level with best efficiency >50% at 6 dB below peak power level (for conventional one) than standard class AB class amplifiers demonstrating efficiency just above 30%. Further, the Doherty amplifier have somewhat less linearity and Gain compared to class AB amplifier. This can be explained by the fact that peak device (operating in C-class) has less gain at peak power level than main device (operating in AB-class), and requires larger input power than main device to allow equal output power for both devices at peaks of input signals. Otherwise linearity of a Doherty amplifier will be poor.

For providing different portions of an RF-input signal to the main and the peak amplifier of the Doherty amplifier an input power divider (like Hybrid) may be used which provides a first input signal for the main amplifier and a second input signal shifted in phase by 90° for the peak amplifier. For this purpose also a 90° transmission line or quarter wavelength transmission line may be used.

Document US 2007/0075780 A1 discloses an apparatus and a method for adaptive biasing of a Doherty amplifier, wherein the peak amplifier is adaptively biased by an output of a biasing circuit.

However, it has been observed that Doherty amplifiers may not exhibit sufficient performance, especially regarding their gain, linearity and/or efficiency.

There may be a need to achieve an amplifier, in particular a Doherty amplifier, which may permit improved amplification especially regarding its gain, linearity and/or efficiency. Further, there may be a need for an integrated RF-amplifier suitable for high power amplification of a RF-signal, wherein the amplification may be improved regarding its quality, such as gain, linearity and/or efficiency.

According to an aspect, a combination amplifier is provided which comprises a first amplifier having a first input terminal and a first output terminal; a second amplifier having a second input terminal and a second output terminal; a first impedance inverter connected between the first input terminal and the second input terminal; and an envelope detector comprising a detector output terminal and a detector input terminal which is connected to the first output terminal.

The combination amplifier may in particular form a Doherty-type amplifier. Both the first amplifier and the second amplifier may comprise any kind of amplifier, such as a transistor comprising a transistor, a tube or the like. In particular, the transistor may be a field effect transistor (FET) like GaN, LDMOS, PHEMT, MOSFET or bipolar junction (BJT) or hetero junction (HBT) transistor or amplifier, or the like.

In particular, both, the first amplifier and the second amplifier may comprise or may be a same FET or different technology devices like FET and HBT, for example. In particular, the first amplifier may be adapted to correspond to a main amplifier of a Doherty amplifier and the second amplifier may be adapted to correspond to a peak amplifier of the Doherty amplifier.

A FET may comprise a gate, a drain and a source terminal, wherein the signal applied to the gate terminal may control the opening and closing of the gate. Thereby, the opened gate may permit electrons to flow through or may block their passage by creating or eliminating a channel between the source terminal and the drain terminal. Electrons may flow from the source terminal towards the drain terminal if influenced by a voltage applied to the gate terminal.

In particular, the first amplifier, also called main amplifier, may be biased to operate in class AB. This kind of biasing may be performed by applying an appropriate voltage at the gate of the first amplifier. Thereby, the first amplifier may linearly amplify an input signal applied to the first input terminal to supply a first output signal at the first output terminal which is at least approximately proportional to the first input signal.

The second amplifier, also called peak amplifier, may be biased to operate in class C. The biasing may be performed by applying an appropriate voltage at the gate of the second amplifier. Thereby, the second amplifier may exhibit less gain and linearity than the first amplifier but may exhibit higher efficiency than the first amplifier.

The first impedance inverter connected between the first input terminal and the second input terminal may divide an input signal supplied to the combination amplifier and provide portions of the input signal which are phase shifted by 90° to the first amplifier and the second amplifier, respectively. The combination amplifier may comprise a combination amplifier input terminal for providing the input signal to the first impedance inverter. In particular, the first input terminal of the first amplifier may be connected to the combination amplifier input terminal, whereas the second input terminal of the second amplifier may be connected to the combination amplifier input terminal through the first impedance inverter.

Further, the combination amplifier may comprise a combination amplifier output terminal to which the second output terminal is directly connected. In contrast, the first output terminal of the first amplifier may be connected to the combination amplifier output terminal through a further impedance inverter, such as a combiner or quarter wavelength transmission line.

The envelope detector may be any device which is responsive to an envelope of a RF-signal through any signal parameter like voltage, current, electric field, magnetic field, power and/or temperature. Further, the envelope detector may detect an amplitude and/or a power of the envelope signal. In particular, the envelope detector input terminal may be connected to the first output terminal thereby allowing to detect an envelope of a first output signal which is supplied by the first amplifier to the first output terminal. For example, the input signal supplied to the combination amplifier may be a RF-signal comprising an amplitude modulated carrier wave having a frequency in the range up to several GHz. In contrast, the amplitude modulation may comprise frequencies up to 100 MHz. In particular, the envelope detector may be adapted to detect amplitude variations of the envelope of the amplified signal having frequencies up to 100 MHz.

Providing the envelope detector connected to the first output terminal may advantageously allow monitoring the first output signal supplied to the first output terminal regarding its envelope, in particular regarding to a temporarily changing amplitude or power. In particular, the output signal may be monitored regarding output impedance and load impedance mismatch, wherein a load may be connected at the second output terminal.

According to an embodiment, the envelope detector may comprise at least one of a directional coupler; a peak voltage detector; a rectifier; a semiconductor diode; an amplification device; a magnetic field sensor; an electric field sensor; a current sensor and/or a temperature sensor. In particular, a directional coupler and a peak voltage detector may be used in combination. In particular, the envelope detector may comprise a peak voltage detector/rectifier which can be designed as a) rectification device/tube or semiconductor diode; b) amplification device like FET, BJT, PHEMT operating in class C, c) current to light transformer like LED. In particular, the magnetic field sensor may comprise a hall sensor which may transform magnetic flux energy into voltage and/or current. In particular, the above enumerated elements comprised in the envelope detector may be responsive to temporal changes of the first output signal which are in a frequency range up to 100 MHz. Providing these components for envelope detection may simplify the combination amplifier and also may improve accuracy of the monitoring of the first output signal.

According to an embodiment, the combination amplifier further comprises a second impedance inverter which is connected between the second output terminal of the second amplifier and the first output terminal of the first amplifier. The second impedance inverter may advantageously combine output signals of the first output terminal and the second output terminal to provide a combination amplifier output signal at the second output terminal. Thereby, in particular the second impedance inverter may phase shift the output signal at the first output terminal by 90°.

The first impedance inverter may comprise lumped element compensation networks comprising only inductances and capacitances, and/or a combination of capacitances, inductances and distributed transmission lines of any kind, such as micro-strip, coplanar, coaxial line or any else appropriate for particular implementation. Further, the first impedance inverter may comprise a bond wire as inductance or two or more parallel bond wires as distributed transmission line.

According to an embodiment, the combination amplifier further comprises a peak device bias control path which connects the detector output terminal of the envelope detector and the second input terminal of the second amplifier. The bias control path may comprise a conductor, such as a wire, and/or may comprise other electronic elements, such as for example an optic waveguide line and/or an optic sensor, for providing the connection allowing minimal time delay of a detected envelope signal. Thus, the connection may be an indirect connection. The bias control path may allow to supply a detector output signal to the second input terminal of the second amplifier. In particular, the second input terminal of the second amplifier may be the gate of the peak amplifier of the Doherty amplifier. Thus, using the detected envelope of the first output signal, i.e. the output signal of the main amplifier, dynamic biasing of the peak amplifier may be enabled. The biasing voltage may vary in a frequency range up to 100 MHz. Thus, the peak amplifier may dynamically be biased to switch between operation classes AB and C or to switch between even further operation classes.

According to an embodiment the combination amplifier further comprises an envelope signal processor which is arranged within the bias control path, wherein the envelope signal processor is adapted to process a detector output signal supplied to the detector output terminal and is arranged to supply the processed detector output signal to the second input terminal. By connecting or arranging the envelope signal processor within the bias control path it may be further enabled to process, transform and/or control the detected envelope signal to optimally set the peak amplifier in a particular operation class depending on the detected envelope signal. In particular, the envelope signal processor may transform or control the envelope signal according to a specified mathematical function, which may result in linear operation of the Doherty amplifier. In particular, the mathematical function may specify threshold level; output voltage versus input voltage dependence; maximal amplitude of output voltage applied to the gate of the peak device; and/or time delay/acceleration of output voltage versus input voltage delivered by said envelope detector. Further processing or controlling may be provided, to optimize the dynamic biasing of the peak amplifier.

According to an embodiment, the envelope signal processor is adapted to process the detector output signal such that the processed detector output signal supplied to the second input terminal controls the second amplifier such that a second amplifier output signal at the second output terminal may allow linear resulting output signal of the combination (or Doherty) amplifier or exact replica of signal applied to the input of Doherty amplifier or the combination amplifier. In particular, the input signal may be applied to the above-mentioned combination amplifier input terminal. Strict linearity may prevail, when phase and amplitude of the second output current or voltage signal at the second output terminal is an exact replica of phase and scaled replica of amplitude of the input current or voltage signal applied to the combination amplifier.

According to an embodiment, the first amplifier and the second amplifier are integrated on a common, or a single, semiconductor chip of any kind, for example comprising GaAs, Si, and/or GaN or the like. Thereby, a very compact combination amplifier may be provided. In particular, the combination amplifier may be used in portable devices, such as mobile phones and the like. In particular, the amplifier may be used to amplify RF-signals to be transmitted using a transmitter.

According to an embodiment, the envelope detector comprises a directional coupler as the envelope detector, wherein the directional coupler comprises the afore-described detector output terminal, wherein the coupler comprises a coupling bond wire which is arranged for electromagnetic coupling to the second impedance inverter. Thereby, a very compact and cost-effective combination amplifier may be provided. In particular, a forward power supplied to a load and a reflected power reflected from a load may be detected by the directional coupler independently from each other at two different output terminals of the coupler. The directional coupler may comprise lumped elements (magnetically coupled bond wires and capacitors) and/or electromagnetically coupled distributed transmission lines which may be arranged on the semiconductor substrate or on a die or on a substrate surface or within a dielectric volume. Thereby, the directional coupler may be used to monitor impedance mismatch at the combination amplifier output terminal. In particular, the directional coupler may be used as a wide frequency band sensor of forward (incident) and reflected power with >20 dB directivity/isolation between the output terminals of the coupler, wherein the portion of the incident power may be used as replica of output signal for a digital pre-distortion system and portion of reflected signal may be used for device or transmitter protection as the amplifier output mismatch indicator. Further, a portion of the incident (forward) power may be used for dynamic bias control of the peak device within the combination amplifier by supplying the incident power to the gate of the peak amplifier through the signal processor. Thereby, the efficiency and linearity and power capability at high power may be improved without loss of gain which is notorious for a conventional Doherty amplifier.

According to an embodiment, the second impedance inverter comprises a second bond wire which is arranged in parallel to the first one allowing magnetic coupling between two bond wires. These bond wires are also electrically coupled by two capacitances connecting bond wire ends. Thereby, electromagnetic coupling may be provided, allowing with this combination an amplifier with very compact bi-directional coupler at output.

According to an embodiment, the combination amplifier further comprises a mismatch detection circuit to which another detector output terminal of the directional coupler is connected. In particular, the mismatch detection circuit may comprise a rectifier and may be connected to the other detector output terminal to detect power reflected from a load connected to the combination amplifier output terminal. Thereby, an impedance mismatch may be detected which may cause harm to the combination amplifier allowing to counteract against the undesired condition.

According to an embodiment, the mismatch detection circuit is adapted to control an operation of the Doherty amplifier. In particular, based on a detected impedance mismatch the mismatch detection circuit may respond in a very short period of time and may shut down the combination amplifier in order to protect failure of the combination amplifier. Further, an alarm signal may be output from the mismatch detection circuit in these circumstances.

Embodiments of the present invention are now described to which the invention is not limited. Thereby, reference is made to the accompanying drawing.

Figure 2:
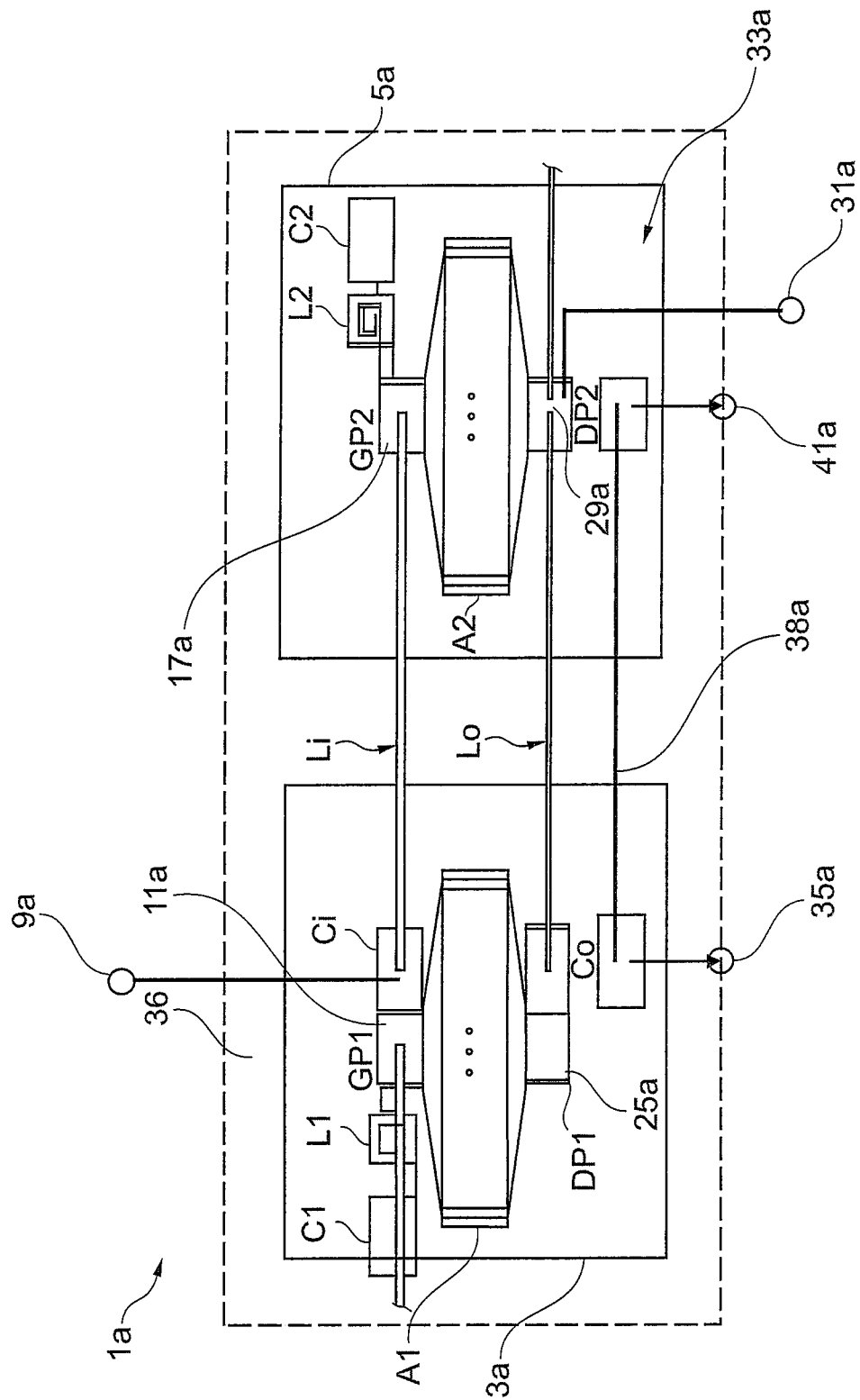
Figure 3:
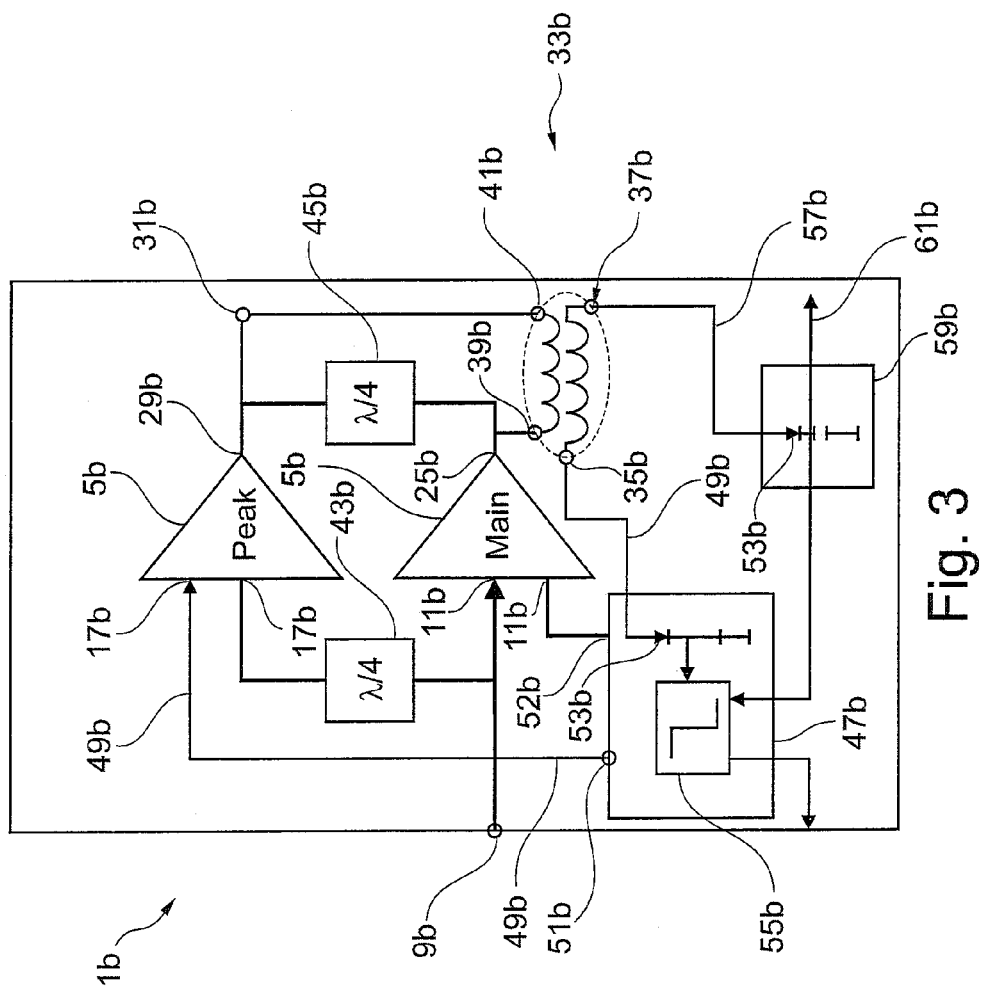

FIG. 1 schematically shows a circuit diagram of a combination amplifier according to an embodiment;

FIG. 2 schematically shows an integrated combination amplifier according to an embodiment;

FIG. 3 schematically shows a circuit diagram of a combination amplifier allowing dynamic biasing according to an embodiment; and FIGS. 4a, 4b and 4c show graphs of properties of a combination amplifiers according to an embodiment.

FIG. 1 shows a circuit diagram of a Doherty amplifier 1 according to an embodiment. The Doherty amplifier 1 comprises a main amplifier 3 and a peak amplifier 5 which are both field effect transistors (FET). The Doherty amplifier 1 further comprises an input section 7 including inductances Li, L1, L2 and capacitors Ci, C1, and C2. Further, the Doherty amplifier 1 comprises within the input section 7 a Doherty amplifier input terminal 9 to which an input signal, such as an RF-signal, e.g. a amplitude modulated signal of the carrier wave of frequency up to several GHz, may be applied for amplification by the Doherty amplifier 1.

The main amplifier 3 embodied as FET comprises a gate terminal 11, a source terminal 13, and a drain terminal 15. The source terminal 13 is connected to ground, i.e. earth potential 20. The main amplifier 3 comprises a main input terminal 23 and a main output terminal 25.

The peak amplifier 5 embodied as an FET also comprises a gate terminal 17, a source terminal 19 and a drain terminal 21. As in the main amplifier 3 the source terminal 19 of the peak amplifier 5 is connected to a ground or earth potential 20. The peak amplifier 5 comprises a peak amplifier input terminal 27 and a peak amplifier output terminal 29.

The gate 11 of the main amplifier is connected to a series arrangement of the inductance L1 and the capacitor C1 which is connected to the ground 20. The gate 17 of the peak amplifier 5 is connected to a series arrangement of the inductance L2 and the capacitor C2 which is connected to the ground 20. Further, one end of the inductance Li is connected to the gate 17 of the peak amplifier 5 and on the other end is connected to the Doherty amplifier input terminal 9. Further, the Doherty amplifier input terminal 9 is connected to the capacitor Ci which in turn is connected to the gate 11 of the main amplifier 3.

In other embodiments the capacitors C1 and C2 may be omitted. The inductance L1 and the capacitor C1 as well as the inductance L2 and the capacitor C2 are integrated lumped element compensation networks at the input section 7 for providing input to the input terminals 23 and 27 of the main amplifier 3 and the peak amplifier 5, respectively. Together with the inductance Li these compensation networks provide the required input power division and relative phase-shift of 90° in the frequency band of signals provided to the input terminals 23 and 27 of the main amplifier 3 and the peak amplifier 5, respectively. Thus, the input section 7 divides the input signal applied at the input terminal 9 into two input portions which are supplied to the input terminals 23 and 27 of the main amplifier 3 and the peak amplifier 5, respectively. Thereby, the two input portions may have same or different strength, such as amplitude or power.

By applying a predetermined voltage at the gate 11 of the main amplifier 3 the main amplifier 3 is operating in operation class AB. By applying an appropriate voltage at the gate 17 of the peak amplifier 5 the peak amplifier 5 is operating in operation class C. The main amplifier 3 and the peak amplifier 5 amplify the portions of the input signal applied to the terminals 23 and 27, respectively, to supply respective portions of the output signal at the main amplifier output terminal 25 and the peak amplifier output terminal 29, respectively.

Main amplifier output terminal 25 is connected to the Doherty amplifier output terminal 31 via the inductance Lo which functions as a 90° transmission line to appropriately shift the phase of the output signal of the main amplifier 3. Thereby, the peak amplifier output terminal 29 may represent a Doherty amplifier output terminal of the Doherty amplifier 1.

Between the output terminal 25 of the main amplifier 3 and the output terminal 29 of the peak amplifier 5 a directional coupler 33 is connected. The bi-directional coupler 33 made of lumped element LC network and connected between output terminal 31 of the Doherty amplifier 1 and load at terminal 35 may allow independent detection of forward signal power level and may also allow also to detect the reflected signal from the load at terminal 37. In particular, the coupler 33 may comprise an inductance which magnetically couples to the inductance Lo by putting them in parallel with a certain distance apart and also are electrically coupled be two capacitances connecting two bond wires ends. The strength of electrical coupling may be defined by a ratio between capacitors connecting 25 with 39 port and 31 with 37 port and capacitors connecting ports 25, 31, 37 and 39 to ground plain, and strength of a magnetic coupling may be defined by distance between two parallel bond wires. To every set of operational frequency band, directivity and characteristic impedance of a coupler a certain set of bond wire inductance, capacitances and distance between bond-wires is required.

In particular, the directional coupler 33 provides an envelope signal of the main amplifier output signal at terminal 25. Thus, monitoring of the main amplifier output signal can be performed using the directional coupler 33.

Further, an impedance mismatch between the output of the Doherty amplifier supplied at terminal 31 and the load of the Doherty amplifier may be detected at terminal 37 of the directional coupler 33. In conventional Doherty amplifiers, such a mismatch can destroy the Doherty amplifier 1 and may become a cause of a base station malfunction or completely failure. Thus, it is advantageous to detect the impedance mismatch in order to react appropriately, for example by shutting down the Doherty amplifier 1, by for example, switching off DC bias voltage of Main and Peak device.

FIG. 2 schematically shows an example of integrated embodiment of a Doherty amplifier 1a using LDMOS or GaN devices, which may be an implementation of Doherty amplifier 1 depicted in the circuit diagram in FIG. 1. Corresponding elements in FIGS. 1 and 2 carry the same reference signs or numbers but may be followed by the lower case letter "a".

The Doherty amplifier 1a comprises the main amplifier 3a and the peak amplifier 5a which comprise gate pads GP1, GP2, respectively and drain pads DP1, DP2, respectively. Further, the main amplifier 3a and the peak amplifier 5a comprise active areas A1, A2, respectively, to which the respective gate pads GP1, GP2, are connected at one side and to which the respective drain pads DP1, DP2 are connected at the other side.

As in the Doherty amplifier 1 illustrated in FIG. 1 the Doherty amplifier input terminal 9a of the Doherty amplifier 1a illustrated in FIG. 2 is connected to the gate pad GP1 of the main amplifier 3a via the capacitor Ci. Also other elements have a similar arrangement and function in both embodiments 1, 1a illustrated in FIGS. 1 and 2, respectively. Thus, for their structure and/or function it is also referred to the description with respect to FIG. 1

The Doherty amplifier 1a comprises a coupling bond wire 38a being arranged parallel to the second impedance inverter Lo which is here configured as a second bond wire connecting the drain pad DP2 of the peak amplifier 5a to a capacitor Co which is connected at its other end to the drain pad DP1 of the main amplifier 3a. The arrangement of the capacitor Co comprised in the main amplifier 3a is also similar to the embodiment illustrated in FIG. 1. The directional coupler formed by the coupling bond wire 38a being arranged in parallel to the second bond wire Lo allows to obtain an envelope signal of the output signal of the main amplifier 3a, wherein the envelope signal is supplied to the terminal 35a. Further, the directional coupler 33a allows monitoring a reflected power from the load at terminal 37a.

FIG. 3 schematically illustrates a circuit diagram of another embodiment of a Doherty amplifier 1b. Herein, reference signs in FIG. 1, 2 having particular signs at the beginning may have same or similar structure and/or function as reference signs in FIG. 3 having the same signs at the beginning but ending with the letter "b".

The Doherty amplifier 1b comprises a main amplifier 3b, a peak amplifier 5b, a Doherty amplifier input terminal 9b and a Doherty amplifier output terminal 31b, wherein in between a main amplifier 3b and a peak amplifier 5b are arranged. Thereby, the input terminal 9b is directly connected to the gate 11b of the main amplifier 3b, whereas the gate 17b of the peak amplifier 5b is connected to the input terminal 9b via the first impedance converter 43b providing a phase-shift of 90°. The output terminal 29b of the peak amplifier 5b is directly connected to the Doherty amplifier output terminal 31b, whereas the output terminal 25b of the main amplifier 3b is connected to the Doherty amplifier output terminal 31b via the second impedance converter 45b providing a phase-shift of 90°.

A directional coupler 33b is provided, wherein a coupler input terminal 39b is connected to the output terminal 25b of the main amplifier 3b. Another input terminal 41b of the directional coupler 33b is connected to the output terminal 29b of the peak amplifier 5b. At an output terminal 35b the directional coupler provides an envelope signal of the output signal of the main amplifier 3b. This envelope signal represents the forward power of the output signal.

For processing the envelope signal the Doherty transistor 1b comprises an envelope signal processor 47b which is arranged within a bias control path 49b which on one hand connects the envelope signal processor 47b to the terminal 35b of the directional coupler 33b and on the other hand connects an output terminal 51b of the envelope signal processor 47b to the gate 17b of the peak amplifier 5b. Thereby, dynamic biasing of the peak amplifier 5b is enabled.

Further, another output terminal 52b of the envelope signal processor 47b is connected to the gate 11b of the main amplifier 3b. Thereby, also dynamic biasing of the main amplifier 3b is enabled, in particular independently from and/or differently to the biasing of the peak amplifier 5b.

In the exemplary illustrated embodiment the envelope signal processor 47b comprises a diode 53b which rectifies the received envelope signal. The rectified envelope signal is further supplied to a low pass filter 55b to remove or to diminish high frequencies in the envelope signal. The thus processed envelope signal is applied via the bias control path 49b to the gate 17b of the peak amplifier 5b.

Another embodiment the envelope signal processor 47b may be adapted for transformation or processing of the envelope signal according to a specified mathematical function which for example specifies threshold level; output voltage versus input voltage dependence; maximal amplitude of output voltage applied to the gate of the peak device; and/or time delay/acceleration of output voltage versus input voltage delivered by the envelope detector or the directional coupler 33b.

At the output terminal 37b of the directional coupler 33b the power reflected from a load connected at terminal 31b may be monitored and may be supplied via a path 57b to a mismatch detection circuit 59b. Mismatch detection circuit 59b is adapted to detect an impedance mismatch between the output impedance at terminal 31b and the load impedance. Based on the detected mismatch the mismatch detection circuit may control the operation of the Doherty transistor 1b via control line 61b. For example, the Doherty amplifier 1b may be shut off via a signal sent through the control line 61b.

FIGS. 4a, 4b and 4c illustrate graphs showing properties of a Doherty amplifier according to an embodiment compared to conventional amplifiers. In FIG. 4a the efficiency (useful output power divided by total consumed DC power) is plotted in dependence of the output power Pout of the amplifier for different amplifiers. The efficiency of a class AB amplifier is depicted as curve 63. The efficiency of a conventional Doherty amplifier is depicted as a curve 65. The efficiency of a Doherty amplifier according to an embodiment is depicted as a curve 67. However, the efficiency 65 of the conventional Doherty amplifier lies above the efficiency 63 of the class AB amplifier and the efficiency 65 of the conventional Doherty amplifier lies below the efficiency 67 of the Doherty amplifier according to embodiments of the present invention.

FIG. 4b depicts a graph showing the gain (output power divided by input power) in dependence of the output power Pout. An ideal amplifier should have a preferably large gain independent of the output power Pout. Curve 69 depicts the gain of a class AB amplifier, curve 71 depicts the gain of a conventional Doherty amplifier and curve 73 depicts the gain of a dynamically biased Doherty amplifier according to embodiments. It can be observed that the dynamically biased Doherty amplifier shows an increased gain relative to the gain of the conventional Doherty amplifier and is comparable to that of AB-class operation.

FIG. 4c depicts a graph showing intermodulation distortions of third order (IMD) measured for different amplifiers. Therein, the IMD of a class AB amplifier is depicted as curve 75, the IMD of a conventional Doherty amplifier is depicted as curve 77 and the IMD of a dynamically biased Doherty amplifier according to an embodiment is depicted as curve 79. As is apparent the IMD of the dynamically biased Doherty amplifier lies below the IMD of the conventional Doherty and only slightly above the IMD of the class AB amplifier.

| REFERENCE SIGNS | |
|---|---|
| 1, 1a, 1b | Doherty amplifiers |
| 3, 3a, 3b | Main amplifiers |
| 5, 5a, 5b | Peak amplifiers |
| 7 | Input section |
| 9, 9a, 9b | Doherty amplifier input terminal |
| 11, 11a, 11b | Gate of main amplifier |
| 13 | Source of main amplifier |
| 15 | Drain of main amplifier |
| 17 | Gate of peak amplifier |
| 19 | Source of peak amplifier |
| 20 | Ground potential |
| 21 | Drain of peak amplifier |
| 23 | Gate pad or input terminal of main amplifier |
| 25 | Drain pad or output terminal of main amplifier |
| 27 | Gate pad or input terminal of peak amplifier |
| 29 | Drain pad or output terminal of peak amplifier |
| 31, 31a, 31b | Doherty amplifier output terminal |
| 33, 33a, 33b | Directional coupler |
| 35b | Forward output terminal of directional coupler |
| 37b | Reflected output terminal of directional coupler |
| 39b | Input terminal of directional coupler |
| 41b | Input terminal of directional coupler |
| Li | Inductance |
| L1 | Inductance |
| C1 | Capacitor |
| L2 | Inductance |
| C2 | Capacitor |
| Lo | Inductance |
| C | Capacitor |
| 38a | Coupling bond wire |
| 43b | First impedance inverter |
| 45b | Second impedance inverter |
| 47b | Envelope signal processor |
| 49b | Bias control path |
| 51b | Output terminal of envelope signal processor |
| 53b | Diode |
| 55b | Low pass filter |
| 57b | Signal line |
| 59b | Mismatch detection circuit |
| 61b | Control line |
| 63 | Efficiency of class AB amplifier |
| 65 | Efficiency of conventional Doherty amplifier |
| 67 | Efficiency of dynamically biased Doherty amplifier |
| 69 | Gain of class AB amplifier |
| 71 | Gain of conventional Doherty amplifier |
| 73 | Gain of dynamically biased Doherty amplifier |
| 75 | IMD of class AB amplifier |
| 77 | IUD of conventional Doherty amplifier |
| 79 | IMD of dynamically biased Doherty amplifier |
| IMD | Intermodulation distortions of third order |

The invention claimed is:

1. Combination amplifier, comprising:
   a first amplifier having a first input terminal and a first output terminal;
   a second amplifier having a second input terminal and a second output terminal;
   a first impedance inverter connected between the first input terminal and the second input terminal; and
   an envelope detector comprising a detector output terminal and a detector input terminal which is connected to the first output terminal, wherein the envelope detector comprises a directional coupler comprising the detector output terminal, the coupler comprising a coupling bond wire which is adapted for electromagnetic coupling to the second impedance inverter.

2. Combination amplifier according to claim 1, wherein the envelope detector comprises at least one of a directional coupler; a peak voltage detector; a rectifier; a semiconductor diode; an amplification device; a magnetic field sensor; an electric field sensor; and a current sensor.

3. Combination amplifier according to claim 1, further comprising a second impedance inverter
which is connected between the second output terminal of the second amplifier and the first output terminal of the first amplifier.

4. Combination amplifier according to claim 1, further comprising
a bias control path
which connects the detector output terminal of the envelope detector and the second input terminal of the second amplifier.

5. Combination amplifier according to claim 4, further comprising
an envelope signal processor
which is arranged within the bias control path, wherein the envelope signal processor is adapted to process a detector output signal supplied by the detector output terminal and is adapted to supply the processed detector output signal to the second input terminal.

6. Combination amplifier according to claim 5, wherein the envelope signal processor is adapted to process the detector output signal such that the processed detector output signal supplied to the second input terminal controls the second amplifier such that an amplifier output signal at the second output terminal depends linearly on an input signal applied to the combination amplifier.

7. Combination amplifier according to claim 1, wherein the first amplifier and the second amplifier are integrated on a common semiconductor chip.

8. The combination amplifier of claim 1, wherein the second impedance inverter comprises
a second bond wire
which is arranged for coupling to the coupling bond wire, in particular arranged parallel to the coupling bond wire.

9. The combination amplifier of claim 1, further comprising
a mismatch detection circuit
to which another detector output terminal of the directional coupler is connected.

10. The combination amplifier of claim 9, wherein the mismatch detection circuit is adapted to control an operation of the combination amplifier.

* * * * *